(12) United States Patent
Thieriot et al.

(10) Patent No.: US 6,584,431 B1
(45) Date of Patent: Jun. 24, 2003

(54) METHOD FOR MONITORING ELECTROMECHANICAL, PNEUMATIC OR HYDRAULIC ACTUATORS, AND IMPLEMENTING DEVICE

(75) Inventors: Didier Thieriot, Nantes (FR); Pierre Darchis, Nantes (FR)

(73) Assignee: La Poste (Exploitant Public), Boulogne Cedex (FR)

( * ) Notice: Subject to any disclaimer, the term of this patent is extended or adjusted under 35 U.S.C. 154(b) by 0 days.

(21) Appl. No.: 09/720,638

(22) PCT Filed: Jun. 24, 1999

(86) PCT No.: PCT/FR99/01518

§ 371 (c)(1),
(2), (4) Date: Dec. 22, 2000

(87) PCT Pub. No.: WO00/00838

PCT Pub. Date: Jan. 6, 2000

(30) Foreign Application Priority Data

Jun. 26, 1998 (FR) .............................................. 98 08359

(51) Int. Cl.[7] ................................................ G06F 11/00
(52) U.S. Cl. ...................................................... 702/183
(58) Field of Search ................................. 702/183, 189, 702/199, 38, 113, 114

(56) References Cited

FOREIGN PATENT DOCUMENTS

| DE | WO/97 20224 | 6/1997 |
|----|-------------|--------|
| EP | 0833166 | 4/1998 |
| FR | 2573212 | 5/1986 |
| SU | 1690019 | * 11/1991 |

OTHER PUBLICATIONS

Database WPI, Section EI, Week 9239 Derwent Publications, SU 1690019; Nov. 1991.

* cited by examiner

Primary Examiner—Michael Nghiem
(74) Attorney, Agent, or Firm—Patterson, Thuente, Skaar & Christensen, LLC

(57) ABSTRACT

A method for monitoring a plurality of identical actuators of a common operational assembly having the following steps: operating actuators one by one in similar powering conditions; measuring the energy agent flux during the excitation cycle of each; elaborating for each a time-based curve of the measure flux; elaborating a superposition from curves, and deducing therefrom a normality tracing; isolating the curves showing variations with respect to the normality tracing; and establishing a trouble shooting for each isolated curve, based on variations.

9 Claims, 4 Drawing Sheets

METHOD FOR MONITORING ELECTROMECHANICAL, PNEUMATIC OR HYDRAULIC ACTUATORS, AND IMPLEMENTING DEVICE

BACKGROUND OF THE INVENTION

1. Field of the Invention

The present invention concerns the monitoring of a plurality of hydraulic, pneumatic or electro-mechanical actuators combined inside a given functional unit.

This unit is typically a postal sorting machine comprising a large number of identical electromagnets allocated to a given function for which it is extremely difficult to date to carry out a detailed effective check as part of preventive maintenance. The same applies for units containing identical pneumatic or hydraulic actuators.

2. Description of the Related Art

A method and device to test a plurality of electric actuators is described in the document WO97/20224. In this system, a plurality of sensors are allocated to each actuator whose measurements are transformed into signals with an identification code. The identified signals are then received in a data processing system where they are compared with nominal values.

When a signal deviates from a nominal value, the information given means that the actuator issuing the signal is defective. This system is cumbersome as first of all a plurality of sensors is provided for each actuator and secondly a set of sensors is required for each actuator.

OBJECTS AND SUMMARY OF THE INVENTION

The invention is the outcome of a solution research to effectively resolve this problem.

It consists of a monitoring and diagnostic device relating to a plurality of identical actuators characterised in that it includes the following stages:

successively and separately feeding each of said plurality of identical actuators, from a given electric, pneumatic or hydraulic energy source and in similar circuit conditions;

establishing for each actuator a reading or curve of the flow measured according to the time;

establishing a superposition from all said curves and defining a track occupied by the largest number and considered in this respect as a normality track;

isolating the curves having deviations relating to said track; and establishing an anomaly diagnostic of each isolated curve on the basis of the deviation(s) it has with said track.

Said superposition can be embodied with the entire part of each of said curves, in which case the period of excitation of the actuators shall be identical for all. It could also be embodied with the significant portions of these curves, in which case the excitation period could vary from one actuator to another.

Depending on whether the actuators are to be electric, pneumatic or hydraulic components, the flow measured shall respectively be a current, a flow of compressed air or a flow of hydraulic liquid.

In practice, it is inevitable that the nominal flows or currents (current or flow recorded in a permanent state under feed) of the various actuators vary slightly within a tolerance range. Before the superposition stage, it would therefore be advantageous to apply a homothetic transformation of each curve so as to bring the value of the detected nominal flow or current down to a selected average value. Of course, prior to this operation, a first examination could have been carried out so as to mark and analyse the nominal current defects (value detected outside said range).

The invention also concerns devices for implementing the method defined above, devices able to be integrated in units or machines comprising the elements to be monitored, or even include independent diagnostic tools.

BRIEF DESCRIPTION OF THE DRAWINGS

These characteristics and advantages of the invention and others shall appear more clearly from the following description with reference to the accompanying drawings on which.

DESCRIPTION OF THE PREFERRED EMBODIMENTS

Figure 1:
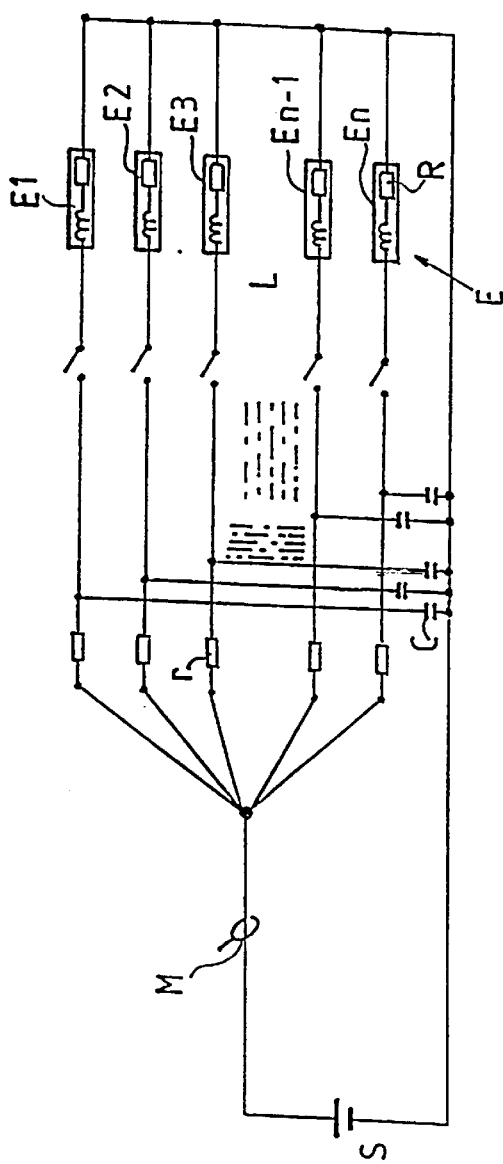
FIG. 1 is a diagrammatic view of a set of actuators connected to a feed source for implementing the invention.

Although in principle the invention is applicable to all types of electromagnetic actuators, it is shown in the drawings and shall be subsequently described relating to electromagnets.

With reference firstly to FIG. 1, this diagrammatically represents a circuit including a plurality of identical electromagnets E and more particularly E1, E2, E3, . . . , En−1, En, symbolised by their resistance R and inductance L and connected in parallel to a common d.c. feed source S so that they can be selectively fed one by one in identical conditions. On FIG. 1, the circuit also includes for each actuator protection and start up boosting means, namely a resistor r and a capacitor C, this mounting being able to take place for example in standard carrousel postal sorting machines inside which a large number of identical actuators are allocated to a given task, such as the opening/closing control of sealing flaps of card index cabinets. Secondly, the mark M denotes a sensor to measure the current at the outlet of the feed source S, said sensor able to be, depending on the case, of the type based on the principle of the Hall effect, or a calibrated shunt arranged in series, etc.

Figure 2:
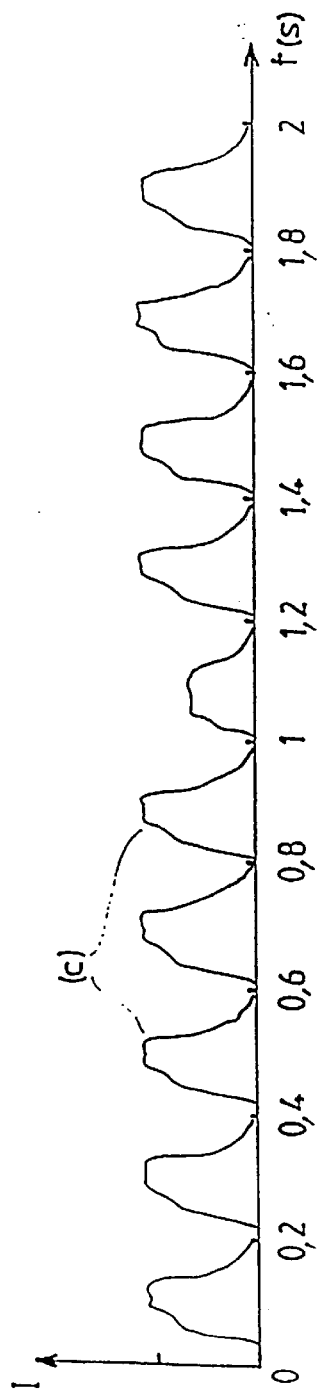
FIG. 2 is a diagram representative of the intensity of the current as a function of time in the actuators of FIG. 1 during each of their successive control cycles.

For this set of actuators E, including the components individually associated with them, namely a resistor r and a capacitor C, the preventive maintenance method of the invention for individually monitoring their condition and diagnosing their defects consists first of all of each being made to function one by one by feeding them individually for a given period from the source S, of continuously measuring the current for each operating cycle, and of recording the time-measured current so as to obtain a succession of curves (c), such as those shown on FIG. 2, for the first ten electromagnets E of the unit.

Figure 3:
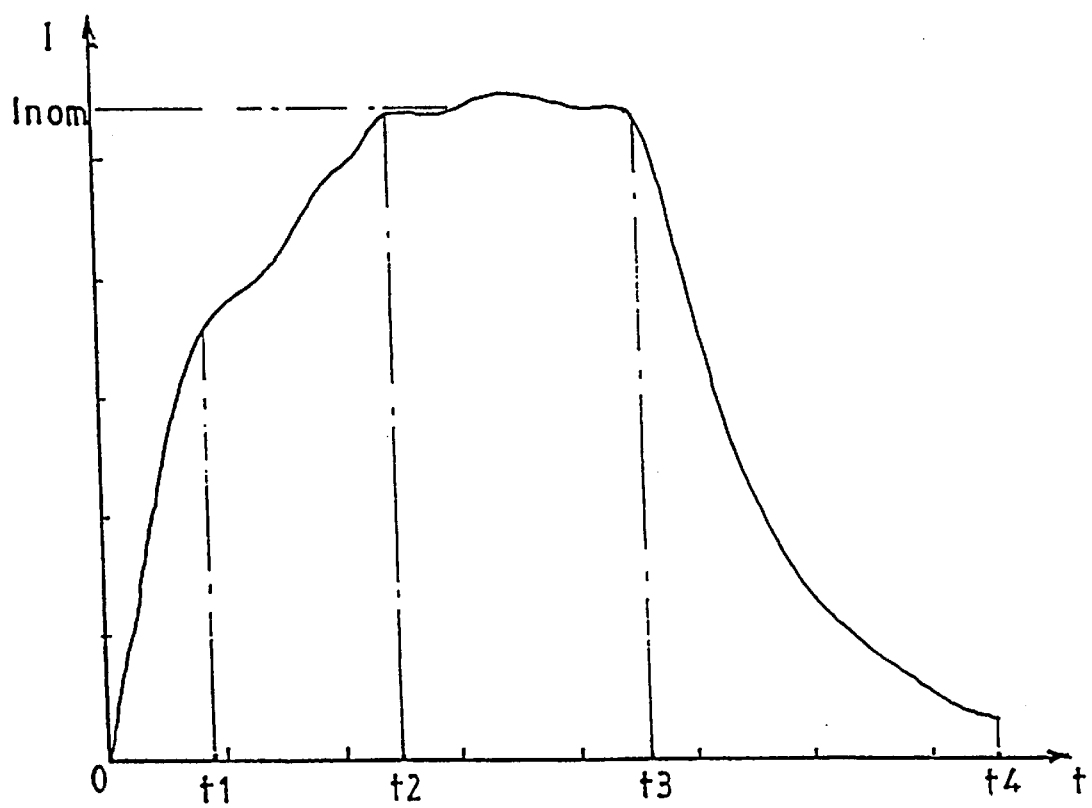
FIG. 3 is a diagram showing on larger scale a curve of FIG. 2 corresponding to the cycle of any one of the actuators.

Each operating cycle has for example a duration of 0.2 seconds with a feed duration of 0.10 seconds. Each curve (c), such as the one of FIG. 3 where the origin of the times corresponds to its start point, comprises a rising front up to the moment t2 whose upper portion beyond a slight inflection at t1 corresponds to the movement of the electromagnet between its idle position and its permanent fed position; an end plate between the moments t2 and t3 corresponding to this permanent feed condition and the level of what it shall be agreed to denote the nominal current Inom of the electromagnet; and a descending front between the moment t3 and the moment t4 at the end of the cycle during which the associated capacitor C is recharged.

At the end of this first stage of the method, a first control can be carried out concerning the value of said nominal current Inom. According to the diagram of FIG. 2, this clearly shows the sixth electromagnet having a serious anomaly on this side owing to the fact that its nominal current Inom is clearly differentiated from all the similar values belonging to the set of the nine others. A first diagnostic could be deduced from this nominal current anomaly, possibly confirmed and/or refined by the subsequent control stages.

Figure 4:
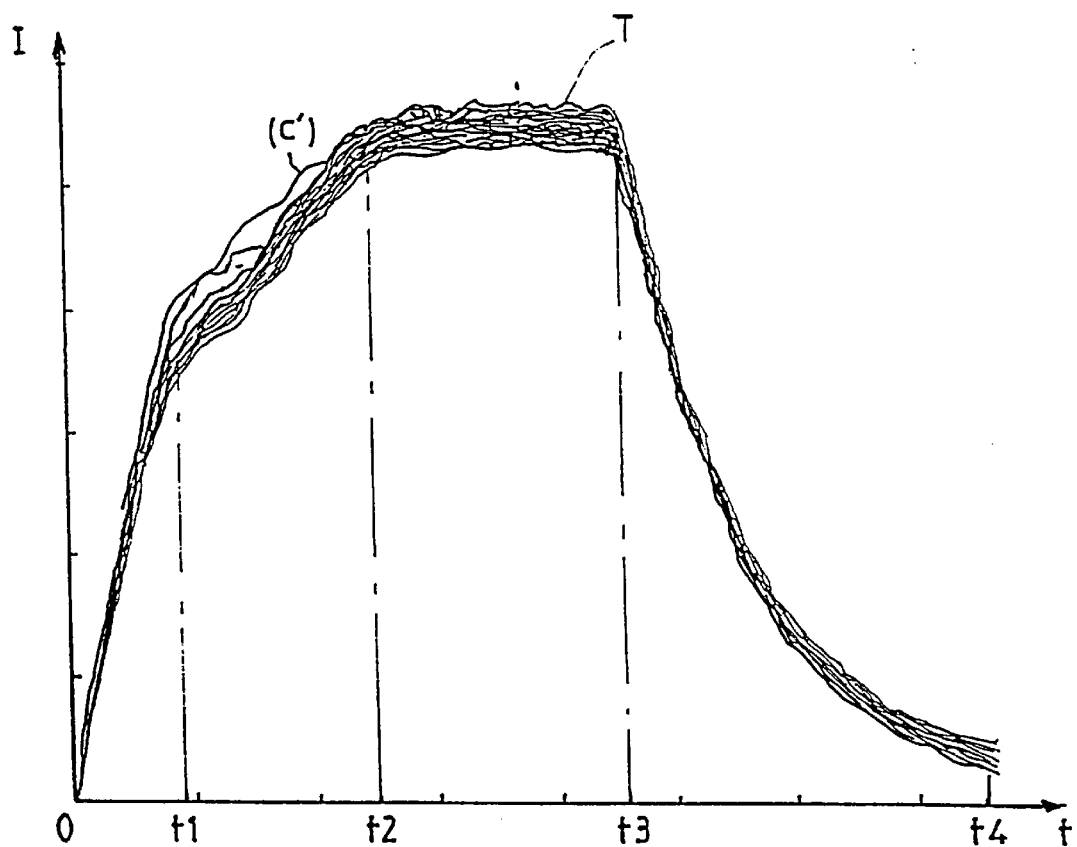
FIG. 4 is a diagram with the same scale as that of FIG. 2 and representing a superposition on the basis of the curves of FIG. 2 corresponding to each of the actuators.

In accordance with the invention, a second stage of the method for controlling and monitoring the actuators E consists of bringing together superimposed on a given diagram (FIG. 4) all the curves of the set of actuators E. Advantageously, said actuators shall have previously undergone a ratio homothetic transformation so as to bring back all the individual average values of the nominal current to a given level so as to eliminate small deviations resulting from the tolerances of the components, especially resistors.

This superposition of curves (c') transformed from the curves (c) (FIG. 4) causes a track T to appear, said track having a particularly dense median portion owing to the fact that it corresponds to the passage of most of the curves, and more transparent edges on both sides of this median portion.

Figure 5:
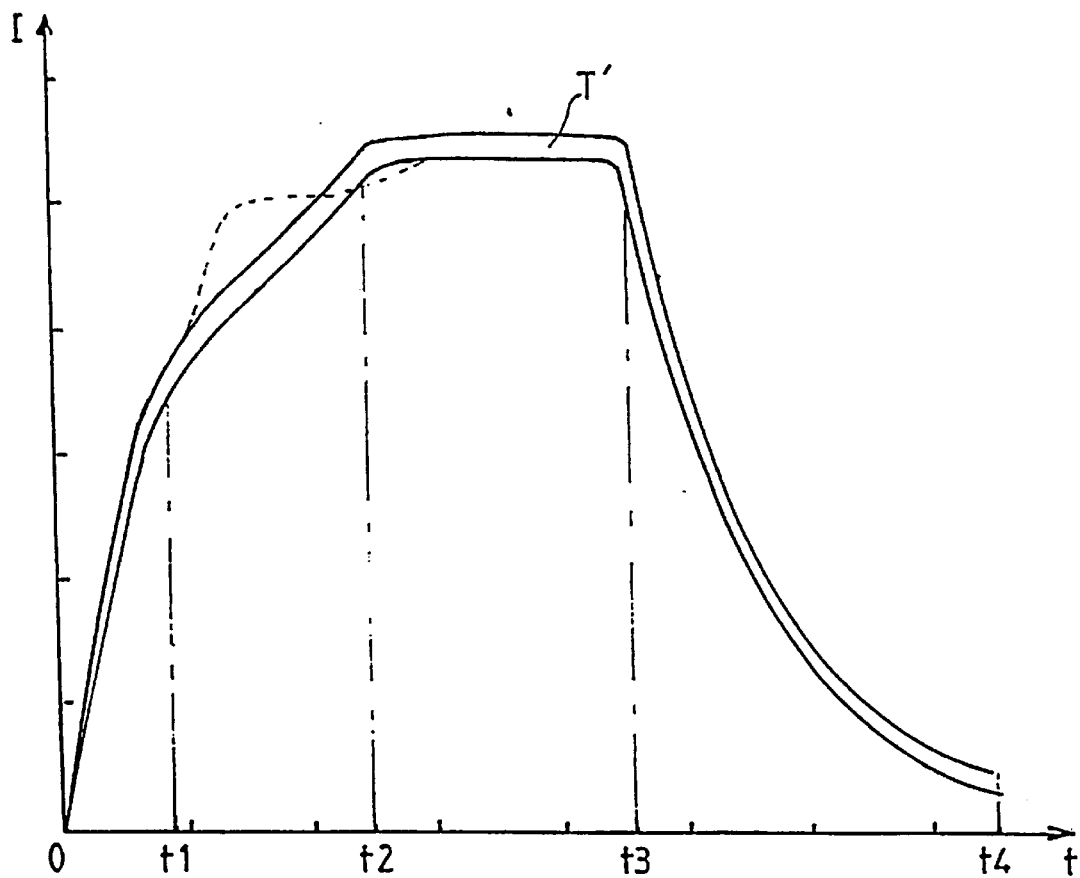
FIG. 5 is a diagram similar to that of FIG. 4 representing said superposition after treatment.

A normality track T' is deduced from the track T (FIG. 5), the normality criterion being the passage zone of the curves (c') for the largest number of electromagnets E. It ought to be noted that the width of the track T' can vary, or more specifically that at various moments of its period, the difference between its lower intensity limit and its upper intensity limit can vary considerably.

The curves retained from all the curves (c') compared one by one with the track T' are those moved away from it into one or several sites. For each, the value of each deviation (average value and/or peak value), its direction (above or below the track T'), its positioning and its significance concerning the duration (calculated, for example, by adding up squares) constitute a large amount of information able to be used for carrying out a precise analysis in terms of any defect and its origin. By way of example, an outlet beyond the track T' in the upper portion of the forward front (t1, t2) as shown by the broken lines on FIG. 5 shall be an indicate a hard mechanical point at the level of the mobile portions of the electromagnet, whereas a deviation in the first portion of the forward front (0, t1) shall disclose a problem of inductance and/or resistors, a deviation at the level of the end plate (t2, t3) a problem of feeding or resistors, and the rear front (t3, t4) a problem of capacitor and resistor r. The accumulated number of several deviations could further reveal a specific failure: for example, a deviation at the level of the first portion of the upstream front (0, t1) with a deviation at the level of the rear front (t3, t4) would probably confirm that the failure originates from an anomaly of the resistor r.

From the foregoing, it can be observed that the significant portions of the curves (c) are mainly their rising front, their descending front and the less significant one is the end plate over its duration. As a result, it is possible to establish a track T' and superpositions with the most significant portions of the curves (c) making it possible to eliminate the constraint of a given excitation period for all the actuators.

A device to implement the diagnostic and preventive maintenance method of the invention referred to above, and thus including for the most part means to control the sequence for putting into operation in turn the actuators, a single current sensor, data recording means and a processing device for obtaining the results, can be fully integrated in a machine or even include a separate test tool able to be used for multiple different sets of actuators and sets of different actuators.

As regards the test tool, this then includes a current sensor, preferably of a type based on the principle of the Hall effect, a control unit able to be connected to that of the machine to be inspected, and data acquisition and storage means. The, processing of the data to obtain the results is preferably carried out by a separate processing unit.

Of course, although the invention has been described with regard to electromagnets, it can also be applied in the same way or with adaptation differences fully implementable by technicians in this particular field, to other categories of electro-mechanical actuators, especially motors, as well as to pneumatic or hydraulic actuators.

The advantages of the invention are its simplicity and thus the low cost of the means it requires for its implementation, as well as its high reliability obtained owing to its automatic calibration principle. There is also an advantage of having a single current or flow sensor which firstly reduces costs and secondly dispenses with difficult and delicate calibration when several of these are required.

What is claimed is:

1. Diagnostic and monitoring method relating to a plurality of identical actuators (E), characterized in that it includes the following stages:

successively and separately feeding each of said plurality of identical actuators (E), from a given electric, pneumatic or hydraulic energy source (S), and in similar circuit conditions;

measuring at a feed outlet of the energy source (S) the energy agent flow during the cycle for exciting each actuator (E);

establishing for each actuator a reading or flow curve (c) measured according to the time;

establishing a superposition from the set of all said curves (c), the superposition (T) obtained defining a track (T') occupied by the largest number of said curves (c) and considered in this respect as a normality track;

isolating the curves having deviations relating to said track (T'); and establishing an anomaly diagnostic of each isolated curve on the basis of the deviation(s) it has with said track (T').

2. Method according to claim 1, characterised in that the excitation period of said actuators (E) is identical for all of them.

3. Method according to claim 1, characterised in that said excitation period of said actuators (E) varies from one actuator to another, said superposition being established from significant portions of said curves (c).

4. Method according to claim 1, characterised in that prior to the superposition stage, a homothetic transformation is applied to each curve (c) so as to bring the value of the detected nominal flow or current (Inom) back to a selected average value, said superposition (T) being embodied with the curves (c') resulting from said transformation of the curves (c).

5. Method according to claim 1, characterised in that prior to the superposition operation, a first control is made by comparing of the curves (c) so as to mark those differentiated from the majority of them at the level of the value of the nominal flow or current (Inom).

6. Method according to claim 1, characterised in that it is applied to electromagnets.

7. Method according to claim 1, characterised in that it is applied to motors.

8. Method according to claim 1, characterised in that it is applied to pneumatic actuators.

9. Method according to claim 1, characterised in that it is applied to hydraulic actuators.

* * * * *